US010989759B1

(12) United States Patent
Du et al.

(10) Patent No.: US 10,989,759 B1
(45) Date of Patent: Apr. 27, 2021

(54) METHOD AND APPARATUS FOR CORRECTING STATE OF CHARGE

(71) Applicant: CONTEMPORARY AMPEREX TECHNOLOGY CO., LIMITED, Fujian (CN)

(72) Inventors: Mingshu Du, Fujian (CN); Shichao Li, Fujian (CN); Shenzhi Tang, Fujian (CN); Li Tan, Fujian (CN); Yanhua Lu, Fujian (CN); Wei Zhang, Fujian (CN)

(73) Assignee: CONTEMPORARY AMPEREX TECHNOLOGY CO., LIMITED, Ningde (CN)

( * ) Notice: Subject to any disclaimer, the term of this patent is extended or adjusted under 35 U.S.C. 154(b) by 0 days.

(21) Appl. No.: 17/134,253

(22) Filed: Dec. 25, 2020

Related U.S. Application Data

(63) Continuation of application No. PCT/CN2020/086198, filed on Apr. 22, 2020.

(30) Foreign Application Priority Data

Jun. 24, 2019 (CN) .......................... 201910547582.8

(51) Int. Cl.
  *G01R 31/367* (2019.01)
  *H02J 7/00* (2006.01)
  *G01R 31/3842* (2019.01)

(52) U.S. Cl.
  CPC ....... *G01R 31/367* (2019.01); *G01R 31/3842* (2019.01); *H02J 7/0048* (2020.01)

(58) Field of Classification Search
  CPC .. G01R 31/367; G01R 31/3842; H02J 7/0048
  (Continued)

(56) References Cited

U.S. PATENT DOCUMENTS 6,060,864 A * 5/2000 Ito .................... G01R 19/16542
  320/136
6,586,940 B2 * 7/2003 Asakura .................. H02M 3/07
  324/426
(Continued)

FOREIGN PATENT DOCUMENTS

CN   106030325 A   10/2016
CN   106405421 A   2/2017
(Continued)

OTHER PUBLICATIONS

Lan Chen et al. "Estimation on the State of Charge of Lithium-ion Battery by Correction Factors Ampere-hour Method," Journal of Shanghai Institute of Technology (Natural Science), Dec. 31, 2014, 14(4):310-313, 318. DOI:10.3969/j.issn.1671-7333.2014.04.008, 5 pages.

(Continued)

*Primary Examiner* — M Baye Diao
(74) *Attorney, Agent, or Firm* — Scully, Scott, Murphy & Presser, P.C.

(57) ABSTRACT

The present application provides a method and apparatus for correcting a state of charge. The method for correcting a state of charge comprises: determining an operating state of a battery cell, wherein the operating state comprises a discharging state or a charging state; and determining a corrected state of charge of the battery cell according to an acquired current open circuit voltage of the battery cell, an acquired current accumulative capacity of the battery cell, an accumulative capacity correspondence relationship corresponding to the operating state of the battery cell, and an open circuit voltage curve corresponding to a limit initial state of charge, wherein the accumulative capacity correspondence relationship comprises a correspondence relationship between a pre-measured open circuit voltage and an accumulative capacity threshold. A technical solution of the (Continued)

present application can be used to improve the accuracy of calculation of a state of charge.

14 Claims, 5 Drawing Sheets

(58) Field of Classification Search
USPC .......................................................... 324/426
See application file for complete search history.

(56) References Cited

U.S. PATENT DOCUMENTS

| | | | | |
|---|---|---|---|---|
| 7,095,211 | B2* | 8/2006 | Denning | G01R 19/16542 320/132 |
| 8,405,356 | B2* | 3/2013 | Nakayama | G01R 31/3842 320/132 |
| 8,519,716 | B2* | 8/2013 | Kurata | G01R 31/3842 324/427 |
| 8,836,284 | B2* | 9/2014 | Takahashi | H01M 10/48 320/122 |
| 9,263,773 | B2* | 2/2016 | Nakamura | H01M 10/42 |
| 9,438,059 | B2* | 9/2016 | Komoda | H01M 10/482 |
| 10,254,346 | B2 | 4/2019 | Nishiguchi et al. | |
| 2010/0121591 | A1 | 5/2010 | Hall | |
| 2011/0311850 | A1* | 12/2011 | Ashida | H02J 7/0021 429/90 |
| 2017/0010327 | A1 | 1/2017 | Nishiguchi et al. | |
| 2017/0176541 | A1 | 6/2017 | Shimizu | |
| 2017/0274794 | A1* | 9/2017 | Tenmyo | G01R 31/367 |
| 2018/0120385 | A1* | 5/2018 | Choi | G01R 31/3648 |
| 2019/0025377 | A1 | 1/2019 | Sejima | |

FOREIGN PATENT DOCUMENTS

| | | |
|---|---|---|
| CN | 106970327 A | 7/2017 |
| CN | 107356874 A | 11/2017 |
| CN | 108474824 A | 8/2018 |
| CN | 108663624 A | 10/2018 |
| CN | 109507611 A | 3/2019 |
| CN | 109557474 A | 4/2019 |
| CN | 110967647 A | 4/2020 |
| JP | 2016114469 A | 6/2016 |
| JP | 2019021417 A | 2/2019 |
| WO | 2014045706 A1 | 3/2014 |
| WO | 2016134496 A1 | 9/2016 |

OTHER PUBLICATIONS

Caipin Zhang et al. "A generalized SOC-OCV model for lithium-ion batteries and the SOC estimation for LNMCO battery," Energies. Energies 2016, 9, 900; DOI:10.3390/en9110900, Dec. 31, 2016, 16 pages.

* cited by examiner

METHOD AND APPARATUS FOR CORRECTING STATE OF CHARGE

CROSS-REFERENCE TO RELATED APPLICATIONS

This application is a continuation of International Application No. PCT/CN2020/086198, filed on Apr. 22, 2020, which claims priority to Chinese Patent Application No. 201910547582.8, filed on Jun. 24, 2019. The disclosures of the aforementioned applications are hereby incorporated by reference in their entireties.

TECHNICAL FIELD

The present application belongs to the technical field of batteries, and particularly relates to a method and apparatus for correcting a state of charge.

BACKGROUND

The state of charge (SOC) is used to represent the ratio of a remaining dischargeable quantity of electricity of a battery to a quantity of electricity of the battery in a fully charged state. The SOC calculation is one of the most important functions of a battery management system, which describes a current state of the battery.

SOC computing methods frequently used at present comprise an ampere-hour integral method, an open circuit voltage method, a neural network method, etc. In the open circuit voltage method, a corresponding relationship between an open circuit voltage (OCV) and an SOC may be used to obtain a stable SOC of the battery. However, in the open circuit voltage method, it is required that the battery is free of a hysteresis characteristic. The hysteresis characteristic refers to a case in which a charging OCV curve does not coincide with a discharging OCV curve, that is, the OCV curve is affected by a historical operating condition, under the same SOC and temperature. If an SOC of a battery with the hysteresis feature is calculated with the open circuit voltage method, an error of the SOC of the battery calculated with the open circuit voltage method will be relatively large, thereby reducing the accuracy of the calculated SOC.

SUMMARY

Embodiments of the present application provide a method and apparatus for correcting a state of charge, which can improve the accuracy of calculation of a state of charge.

In a first aspect, an embodiment of the present application provides a method for correcting a state of charge, the method comprising: determining an operating state of a battery cell, wherein the operating state comprises a discharging state or a charging state; and determining a corrected state of charge of the battery cell according to an acquired current open circuit voltage of the battery cell, an acquired current accumulative capacity of the battery cell, an accumulative capacity correspondence relationship corresponding to the operating state of the battery cell, and an open circuit voltage curve corresponding to a limit initial state of charge, wherein the accumulative capacity correspondence relationship comprises a correspondence relationship between a pre-measured open circuit voltage and an accumulative capacity threshold.

In a second aspect, an embodiment of the present application provides an apparatus for correcting a state of charge, the apparatus comprising: a state determination module configured to determine an operating state of a battery cell, wherein the operating state comprises a discharging state or a charging state; and a correction module configured to determine a corrected state of charge of the battery cell according to an acquired current open circuit voltage of the battery cell, an acquired current accumulative capacity of the battery cell, an accumulative capacity correspondence relationship corresponding to the operating state of the battery cell, and an open circuit voltage curve corresponding to a limit initial state of charge, wherein the accumulative capacity correspondence relationship comprises a correspondence relationship between a pre-measured open circuit voltage and an accumulative capacity threshold.

In the embodiments of the present application, an operating state of a battery cell is determined, and a corrected state of charge of the battery cell is determined according to an acquired current open circuit voltage of the battery cell, an acquired current accumulative capacity of the battery cell, an accumulative capacity correspondence relationship corresponding to the operating state of the battery cell, and an open circuit voltage curve corresponding to a limit initial state of charge, wherein the accumulative capacity correspondence relationship comprises a correspondence relationship between a pre-measured open circuit voltage and an accumulative capacity threshold. The accumulative capacity correspondence relationship may represent a historical operating condition of the battery cell. A parameter capable of guaranteeing the historical operating condition of the battery cell is introduced into a calculation process of the state of charge, that is to say, in the calculation process of the state of charge, the state of charge of the battery cell is corrected by considering the historical operating condition of the battery cell, and the corrected state of charge is used as the state of charge of the battery cell, thereby reducing influence of the historical operating condition on calculation of the state of charge, and improving the accuracy of calculation of the state of charge.

BRIEF DESCRIPTION OF DRAWINGS

The present application may be better understood from the following description of specific implementations thereof in conjunction with the accompanying drawings, in which the same or similar reference numerals represent the same or similar features.

DESCRIPTION OF EMBODIMENTS

The features and exemplary embodiments of various aspects of the present application will be described in detail below. In the following detailed description, many specific details are set forth to provide a thorough understanding of the present application. However, it will be obvious to those skilled in the art that the present application may be implemented without some of these specific details. The following description of the embodiments is merely to provide a better understanding of the present application by means of illustration of examples of the present application. The present application is by no means limited to any specific configuration and algorithm set forth below, but covers any modification, replacement, and improvement of an element, a component, and an algorithm without departing from the spirit of the present application. In the accompanying drawings and the following description, well-known structures and technologies are not shown in order to avoid unnecessarily ambiguity of the present application.

The embodiments of the present application may provide a method and apparatus for correcting a state of charge, which can be applied to a scenario in which a state of charge of a battery is calculated, and are executed by a battery management system (BMS). In the embodiments of the present application, a state of charge of a battery cell can be corrected, and states of charge of a battery module and a battery pack can further be determined according to the state of charge of the battery cell. Details are not repeatedly described here. By means of the method and apparatus for correcting a state of charge in the embodiments of the present application, a state of charge of a battery cell with a hysteresis characteristic may be corrected to improve the accuracy of a calculated state of charge of the battery cell with the hysteresis characteristic.

Figure 1:
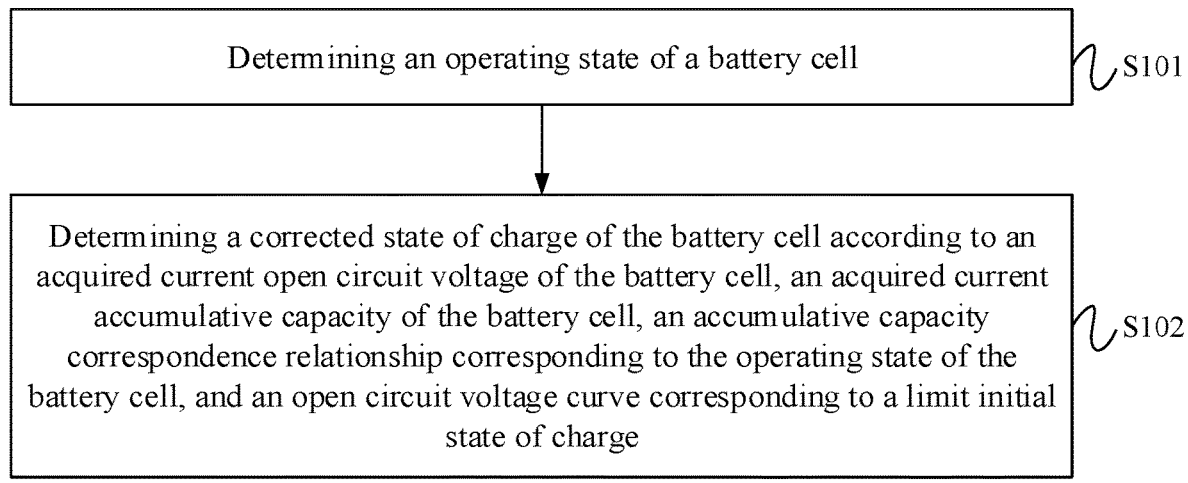
FIG. 1 is a flowchart of a method for correcting a state of charge according to an embodiment of the present application.

FIG. 1 is a flowchart of a method for correcting a state of charge according to an embodiment of the present application. As shown in FIG. 1, the method for correcting a state of charge comprises steps S101 and S102.

In step S101, an operating state of a battery cell is determined.

The operating state comprises a discharging state or a charging state. If the operating state of the battery cell is the discharging state, the battery cell is being discharged, or the battery cell is mainly discharged during a recent time period. For example, in the case of recharging for a very short time during long-time discharging, the operating state of the battery cell is also considered to be the discharging state. If the operating state of the battery cell is the charging state, the battery cell is being charged, or the battery cell is mainly charged during a recent time period. For example, in the case of discharging for a very short time during long-time charging, the operating state of the battery cell is also considered to be the charging state.

In step S102, a corrected state of charge of the battery cell is determined according to an acquired current open circuit voltage of the battery cell, an acquired current accumulative capacity of the battery cell, an accumulative capacity correspondence relationship corresponding to the operating state of the battery cell, and an open circuit voltage curve corresponding to a limit initial state of charge.

The current open circuit voltage of the battery cell is an open circuit voltage (OCV) of the battery cell at a current moment. The current accumulative capacity of the battery cell is an accumulative capacity of the battery cell in a time period up to the current moment. The time period up to the current moment does not comprise a standing time. The standing time is a time when the battery cell is not in the operating state, or a time when a current in a circuit where the battery cell is located is continuously less than a preset current threshold. It should be noted that the standing time may be calculated accumulatively. The accumulative capacity comprises an accumulative charging capacity and an accumulative discharging capacity. The accumulative capacity correspondence relationship comprises a correspondence relationship between a pre-measured open circuit voltage and an accumulative capacity threshold. In other words, the accumulative capacity correspondence relationship indicates correspondence relationships between different open circuit voltages and accumulative capacity thresholds in a historical operating condition. The accumulative capacity threshold is a maximum value or a minimum value of an allowed or required accumulative capacity, which is obtained through statistics collection in a preset time period, wherein the present time period does not comprise the standing time. The limit initial state of charge may comprise 100% and/or 0%. If the limit initial state of charge comprises 100%, the open circuit voltage curve corresponding to the limit initial state of charge is a discharging open circuit voltage curve with an initial state of charge being 100%, namely, a fully-charged discharging open circuit voltage curve (namely, a fully-charged discharging OCV curve). The open circuit voltage curve represents a correspondence relationship between an open circuit voltage and a state of charge (SOC). It should be noted that in this embodiment of the present application, it is not limited to the use of an open circuit voltage curve, and other forms such as a table that can indicate the correspondence relationship between the open circuit voltage and the state of charge is also applicable to the present application.

In some examples, an accumulative capacity threshold corresponding to the current open circuit voltage may be obtained through querying based on the acquired current open circuit voltage of the battery cell and an open circuit voltage curve corresponding to the operating state of the battery cell. Then the corrected state of charge of the battery cell is determined based on the acquired current accumulative capacity of the battery cell, the accumulative capacity threshold corresponding to the current open circuit voltage, and the open circuit voltage curve corresponding to the limit initial state of charge. The corrected state of charge is higher in accuracy.

The corrected state of charge of the battery cell is used to replace a calculated state of charge of the battery cell, and the calculated state of charge of the battery cell is a state of charge calculated by means of a real-time state of charge calculation method, for example, a state of charge calculated by means of an open circuit voltage method, a neural network method and a Kalman filtering method. Since there may be a relatively large error in the state of charge calculated by means of the real-time state of charge calculation method, the method for correcting a state of charge in this embodiment of the present application may be used for correction, and an obtained corrected state of charge of the battery cell is higher in accuracy.

In this embodiment of the present application, an operating state of a battery cell is determined, and a corrected state of charge of the battery cell is determined according to an acquired current open circuit voltage of the battery cell, an acquired current accumulative capacity of the battery cell, an accumulative capacity correspondence relationship corresponding to the operating state of the battery cell, and an open circuit voltage curve corresponding to a limit initial state of charge, wherein the accumulative capacity correspondence relationship comprises a correspondence relationship between a pre-measured open circuit voltage and an accumulative capacity threshold. The accumulative capacity correspondence relationship may represent a historical operating condition of the battery cell. A parameter capable of guaranteeing the historical operating condition of the battery cell is introduced into a calculation process of the state of charge, that is to say, in the calculation process of the state of charge, the state of charge of the battery cell is corrected by considering the historical operating condition of the battery cell, and the corrected state of charge is used as the state of charge of the battery cell, thereby reducing influence of the historical operating condition on calculation of the state of charge, and improving the accuracy of calculation of the state of charge. Moreover, since a calculated state of charge can be corrected, applicability of calculation of the state of charge is further improved.

Figure 2:
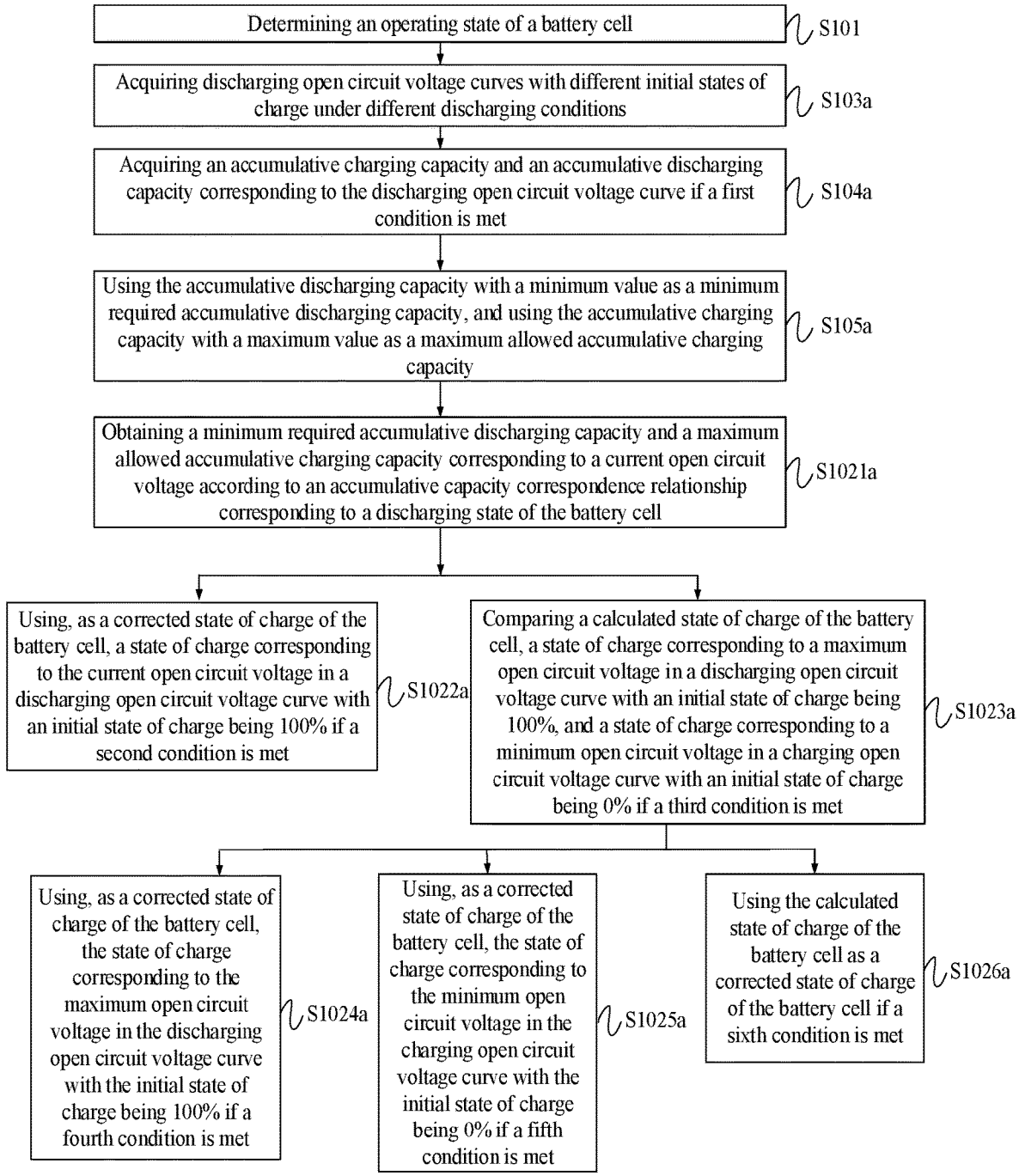
FIG. 2 is a flowchart of a method for correcting a state of charge according to another embodiment of the present application.

FIG. 2 is a flowchart of a method for correcting a state of charge according to another embodiment of the present application. An operating state of a battery cell comprises a discharging state. Correspondingly, an accumulative capacity threshold comprises a minimum required accumulative discharging capacity and a maximum allowed accumulative charging capacity. A difference between FIG. 2 and FIG. 1 lies in that the method for correcting a state of charge shown in FIG. 2 may further comprise steps S103a, S104a and S105a. Step S102 in the above embodiment can be specifically subdivided into steps from S1021a to S1026a.

In step S103a, discharging open circuit voltage curves with different initial states of charge under different discharging conditions are acquired.

In some examples, the discharging conditions comprise a discharging rate, a test operating condition, etc. For example, the test operating condition is a recharging operating condition after the discharging and the like. Under the same discharging condition, different initial states of charge may be set, for example, the battery cell is charged to different states of charge after being fully discharged, and the different states of charge obtained through charging after the battery cell is fully discharged are used as initial states of charge. The battery cell is discharged under the same discharging condition by using an initial state of charge as a start.

For example, after being fully discharged, the battery cell is charged to a state of charge being 60%, and is discharged by using the state of charge being 60% as the initial state of charge of the battery cell, to obtain a discharging open circuit voltage curve of the battery cell in the state of charge being 60%. Specifically, the battery cell in the initial state of charge being 60% may be discharged by 6% and then recharged by 1% each time until the state of charge of the battery cell is 0%.

For another example, after being fully discharged, the battery cell is charged to a state of charge being 80%, and is discharged by using the state of charge being 80% as the initial state of charge of the battery cell, to obtain a discharging open circuit voltage curve of the battery cell in the state of charge being 80%. Specifically, the battery cell in the initial state of charge being 80% may be discharged by 7% and then recharged by 2% each time until the state of charge of the battery cell is 0%.

One initial state of charge under the same discharging condition corresponds to one discharging open circuit voltage curve. Different initial states of charge under different discharging conditions correspond to a plurality of discharging open circuit voltage curves.

It should be noted that the same discharging condition means that factors in the discharging condition are the same. For example, the discharging condition comprises a discharging rate and a test operating condition, and if a discharging condition A1 and a discharging condition A2 are the same discharging condition, the discharging condition A1 and the discharging condition A2 are the same in the discharging rate and the test operating condition.

In step S104a, if a first condition is met, an accumulative charging capacity and an accumulative discharging capacity corresponding to a discharging open circuit voltage curve are acquired.

The first condition comprises: an error between a state of charge corresponding to a first open circuit voltage in the discharging open circuit voltage curve and a state of charge corresponding to the first open circuit voltage in a discharging open circuit voltage curve with an initial state of charge being 100% falls into a preset error accuracy range.

The first open circuit voltage is acquired, and the state of charge corresponding to the first open circuit voltage is searched in each discharging open circuit voltage curve. A limit initial state of charge in this embodiment of the present application comprises 100%. Detection is performed on an error between the state of charge corresponding to the first open circuit voltage in each discharging open circuit voltage curve and the state of charge corresponding to the first open circuit voltage in the discharging open circuit voltage curve with the initial state of charge being 100% (namely, a fully-charged discharging open circuit voltage curve). The preset error accuracy range is an acceptable error accuracy range during calculation of the state of charge. When an error falls into the preset error accuracy range, it indicates that a state of charge in a discharging open circuit voltage curve does not have an unacceptable effect on the calculation of the state of charge, and the accuracy of data acquired from the discharging open circuit curve is relatively high. Therefore, the discharging open circuit curve can be used to acquire an accumulative capacity threshold, so as to establish an accumulative capacity correspondence relationship.

In step S105a, the accumulative discharging capacity with a minimum value is used as a minimum required accumulative discharging capacity, and the accumulative charging capacity with a maximum value is used as a maximum allowed accumulative charging capacity.

In step S104a, a plurality of discharging open circuit voltage curves that meet the preset error accuracy range may be obtained, and each discharging open circuit curve correspondingly has an accumulative discharging capacity and an accumulative charging capacity. A minimum value of accumulative discharging capacities corresponding to the plurality of discharging open circuit curves is used as the minimum required accumulative discharging capacity. A maximum value of accumulative discharging capacities corresponding to the plurality of discharging open circuit curves is used as the maximum allowed accumulative charging capacity.

The minimum required accumulative discharging capacity refers to a discharging capacity at least required to be discharged by the battery cell in order to prevent a discharging open circuit curve from being influenced by a historical operating condition. If the accumulative discharging capacity is less than the minimum required accumulative discharging capacity, it cannot be guaranteed that a discharging open circuit curve at this moment coincides with or is close enough to a fully-charged discharging open circuit voltage curve. The maximum allowed accumulative charging capacity refers to a charging capacity which can be at most charged to the battery cell in order to prevent a discharging open circuit curve from being influenced by the historical operating condition.

In step S1021a, a minimum required accumulative discharging capacity and a maximum allowed accumulative charging capacity corresponding to a current open circuit voltage are obtained according to an accumulative capacity correspondence relationship corresponding to the discharging state of the battery cell.

The accumulative capacity correspondence relationship in the above embodiment comprises a correspondence relationship between a pre-measured open circuit voltage and the minimum required accumulative discharging capacity and a correspondence relationship between the pre-measured open circuit voltage and the maximum allowed accumulative charging capacity. For example, the accumulative capacity correspondence relationship can be indicated in the form of a table. Table 1 is a table of the accumulative capacity correspondence relationship in this embodiment of the present application:

TABLE 1

| Open circuit voltage | | OCV1 | OCV2 | OCV3 | OCV4 | OCV5 |
|---|---|---|---|---|---|---|
| Discharging state | Minimum required accumulative discharging capacity | Discharging capacity B1 | Discharging capacity B2 | Discharging capacity B3 | Discharging capacity B4 | Discharging capacity B5 |
| | Maximum allowed accumulative charging capacity | Charging capacity C1 | Charging capacity C2 | Charging capacity C3 | Charging capacity C4 | Charging capacity C5 |

Minimum required accumulative discharging capacities and maximum allowed accumulative charging capacities respectively corresponding to the five open circuit voltages, namely, OCV1, OCV2, OCV3, OCV4 and OCV5, in the discharging state are recorded in Table 1. A corresponding minimum required accumulative discharging capacity and maximum allowed accumulative charging capacity can be queried according to an open circuit voltage in Table 1. For example, if the current open circuit voltage of the battery cell is OCV3, the open circuit voltage OCV3 corresponds to the minimum required accumulative discharging capacity B3 and the maximum allowed accumulative charging capacity C3.

In step S1022a, if a second condition is met, a state of charge corresponding to the current open circuit voltage in the discharging open circuit voltage curve with the initial state of charge being 100% is used as a corrected state of charge of the battery cell.

The second condition comprises: an acquired current accumulative charging capacity is less than the maximum allowed accumulative charging capacity corresponding to the current open circuit voltage, and an acquired current accumulative discharging capacity is greater than the minimum required accumulative discharging capacity corresponding to the current open circuit voltage.

The limit initial state of charge comprises 100%.

In the above embodiment, a current accumulative capacity of the battery cell comprises the current accumulative charging capacity $\Delta ChrgCap$ and the current accumulative discharging capacity $\Delta DischrgCap$. If the acquired current accumulative charging capacity $\Delta ChrgCap$ is less than the maximum allowed accumulative charging capacity $\Delta MaxCap\_Chrg$ corresponding to the current open circuit voltage in the accumulative capacity correspondence relationship, and the acquired current accumulative discharging capacity $\Delta DischrgCap$ is greater than the minimum required accumulative discharging capacity $\Delta MinCap\_Dischrg$ corresponding to the current open circuit voltage in the accumulative capacity correspondence relationship, the discharging open circuit voltage curve with the initial state of charge being 100% (namely, a fully-charged discharging open circuit voltage curve) may be directly used to correct the state of charge of the battery cell. Specifically, the state of charge corresponding to the current open circuit voltage in the discharging open circuit voltage curve with the initial state of charge being 100% is used as the corrected state of charge of the battery cell.

In step S1023a, if a third condition is met, a calculated state of charge of the battery cell, a state of charge corresponding to a maximum open circuit voltage in the discharging open circuit voltage curve with the initial state of charge being 100%, and a state of charge corresponding to a minimum open circuit voltage in a charging open circuit voltage curve with an initial state of charge being 0% are compared.

The third condition comprises: an acquired current accumulative charging capacity is greater than or equal to the maximum allowed accumulative charging capacity corresponding to the current open circuit voltage, or an acquired current accumulative discharging capacity is smaller than or equal to the minimum required accumulative discharging capacity corresponding to the current open circuit voltage.

If the acquired current accumulative charging capacity $\Delta ChrgCap$ is greater than or equal to the maximum allowed accumulative charging capacity $\Delta MaxCap\_Chrg$ corresponding to the current open circuit voltage in the accumulative capacity correspondence relationship, or the acquired current accumulative discharging capacity $\Delta DischrgCap$ is less than or equal to the minimum required accumulative discharging capacity $\Delta MinCap\_Dischrg$ corresponding to the current open circuit voltage in the accumulative capacity correspondence relationship, the calculated state of charge of the battery cell can be corrected by means of the following steps S1024a to S1026a based on the calculated state of charge of the battery cell, the state of charge corresponding to the maximum open circuit voltage (namely, a maximum value of the corrected state of charge) in the discharging open circuit voltage curve with the initial state of charge being 100% (namely, a fully-charged discharging open circuit voltage curve), and the state of charge corresponding to the minimum open circuit voltage (namely, a minimum value of the corrected state of charge) in the charging open circuit voltage curve with the initial state of charge being 0% (namely, a fully-discharged charging open circuit curve).

In step S1024a, if a fourth condition is met, the state of charge corresponding to the maximum open circuit voltage in the discharging open circuit voltage curve with the initial state of charge being 100% is used as a corrected state of charge of the battery cell.

The fourth condition comprises: the calculated state of charge of the battery cell is greater than the state of charge corresponding to the maximum open circuit voltage in the discharging open circuit voltage curve with the initial state of charge being 100%.

In step S1025a, if a fifth condition is met, the state of charge corresponding to the minimum open circuit voltage in the charging open circuit voltage curve with the initial state of charge being 0% is used as a corrected state of charge of the battery cell.

The fifth condition comprises: the calculated state of charge of the battery cell is less than the state of charge corresponding to the minimum open circuit voltage in the charging open circuit voltage curve with the initial state of charge being 0%.

In step S1026a, if a sixth condition is met, the calculated state of charge of the battery cell is used as a corrected state of charge of the battery cell.

The sixth condition comprises: the calculated state of charge of the battery cell is less than or equal to the state of charge corresponding to the maximum open circuit voltage in the discharging open circuit voltage curve with the initial state of charge being 100%, and is greater than or equal to the state of charge corresponding to the minimum open circuit voltage in the charging open circuit voltage curve with the initial state of charge being 0%.

The limit initial state of charge comprises 100% and 0%.

The state of charge corresponding to the maximum open circuit voltage in the discharging open circuit voltage curve with the initial state of charge being 100% and the state of charge corresponding to the minimum open circuit voltage in the charging open circuit voltage curve with the initial state of charge being 0% define a range of the corrected state of charge. The state of charge corresponding to the maximum open circuit voltage in the discharging open circuit voltage curve with the initial state of charge being 100% is used as an upper limit of the range of the corrected state of charge, and the state of charge corresponding to the minimum open circuit voltage in the charging open circuit voltage curve with the initial state of charge being 0% is used as a lower limit of the range of the corrected state of charge.

If the calculated state of charge of the battery cell falls into the above range of the corrected state of charge, it is indicated that the calculated state of charge of the battery cell is relatively accurate, and the calculated state of charge of the battery cell can be used as the corrected state of charge of the battery cell. If the calculated state of charge of the battery cell is greater than the upper limit of the above range of the corrected state of charge, the state of charge of the battery cell is modified to serve as the upper limit of the above range of the corrected state of charge, that is to say, the upper limit of the above range of the corrected state of charge is used as the corrected state of charge of the battery cell. If the calculated state of charge of the battery cell is less than the lower limit of the above range of the corrected state of charge, the state of charge of the battery cell is modified to serve as the lower limit of the above range of the corrected state of charge, that is to say, the lower limit of the above range of the corrected state of charge is used as the corrected state of charge of the battery cell.

Figure 3:
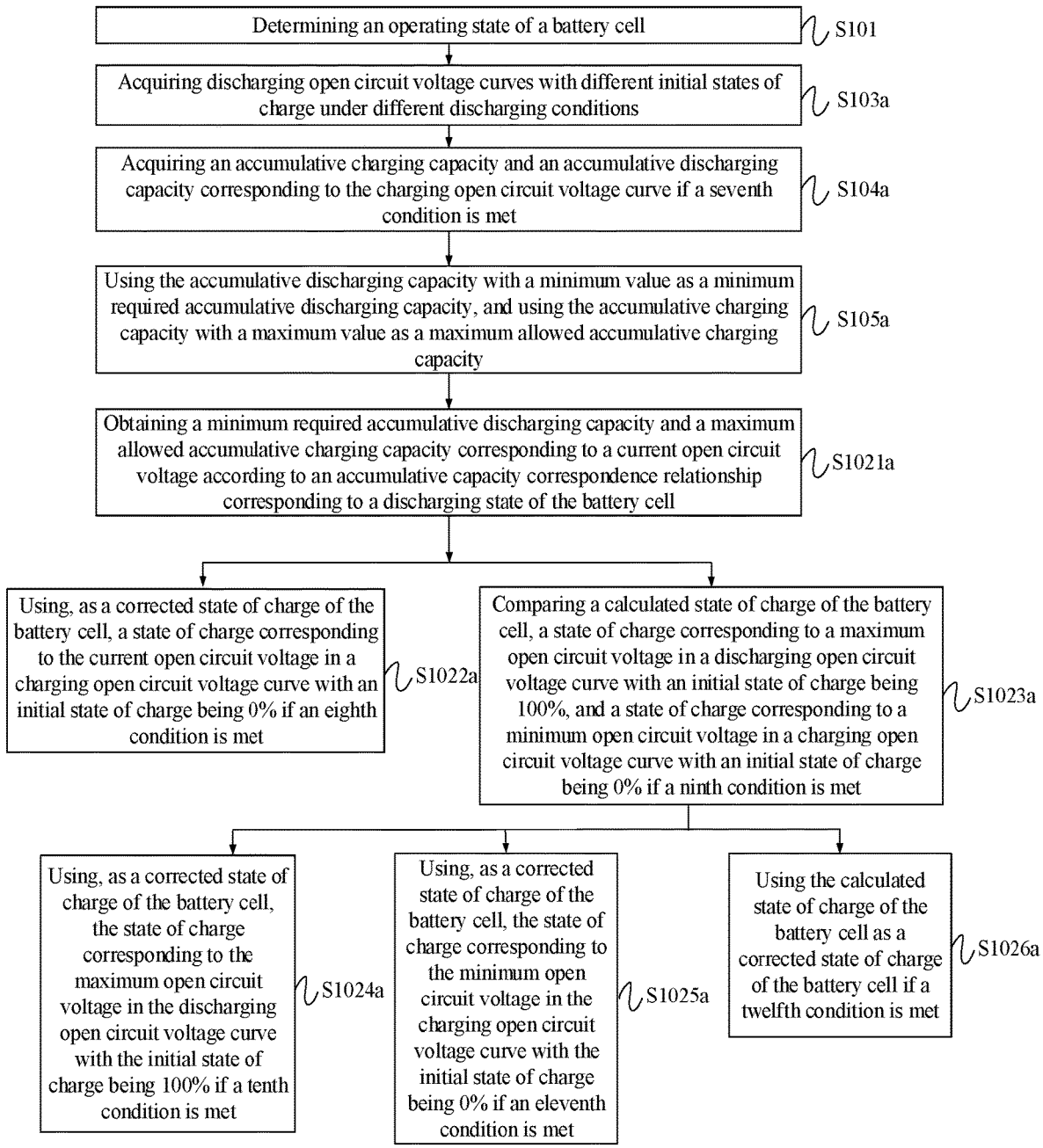
FIG. 3 is a flowchart of a method for correcting a state of charge according to still another embodiment of the present application.

FIG. 3 is a flowchart of a method for correcting a state of charge according to still another embodiment of the present application. An operating state of a battery cell comprises a charging state. Correspondingly, the accumulative capacity threshold comprises a maximum allowed accumulative discharging capacity and a minimum required accumulative charging capacity. A difference between FIG. 3 and FIG. 1 lies in that the method for correcting a state of charge shown in FIG. 3 may further comprise steps S103b, S104b and S105b. Step S102 in the above embodiment can be specifically subdivided into steps from S1021b to S1026b.

In step S103b, charging open circuit voltage curves with different initial states of charge under different charging conditions are acquired.

In some examples, the charging conditions comprise a charging rate, a test operating condition, etc. For example, the test operating condition is a discharging operating condition after the charging and the like. Under the same charging condition, different initial states of charge may be set, for example, the battery cell is discharged to different states of charge after being fully charged, and the different states of charge obtained through discharging after the battery cell is fully charged are used as initial states of charge. The battery cell is charged under the same charging condition by using an initial state of charge as a start.

For example, after being fully charged, the battery cell is discharged to a state of charge being 40% and is charged by using the state of charge being 40% as the initial state of charge of the battery cell, to obtain a charging open circuit voltage curve of the battery cell in the initial state of charge being 40%. Specifically, the battery cell in the initial state of charge being 40% may be charged by 6% and then discharged by 1% each time until the state of charge of the battery cell is 100%.

For another example, after being fully charged, the battery cell is discharged to a state of charge being 60% and is charged by using the state of charge being 60% as the initial state of charge of the battery cell, to obtain a charging open circuit voltage curve of the battery cell in the initial state of charge being 60%. Specifically, the battery cell in the initial state of charge being 60% may be charged by 7% and then discharged by 2% each time until the state of charge of the battery cell is 100%.

One initial state of charge under the same charging condition corresponds to one charging open circuit voltage curve. Different initial states of charge under different discharging conditions correspond to a plurality of charging open circuit voltage curves.

It should be noted that the same charging condition means that factors in the charging condition are the same. For example, the charging condition comprises a charging rate and a test operating condition, and if a charging condition D1 and a charging condition D2 are the same charging condition, the charging condition D1 and the charging condition D2 are same in the charging rate and the test operating condition.

In step S104b, if a seventh condition is met, an accumulative charging capacity and an accumulative discharging capacity corresponding to a charging open circuit voltage curve are acquired.

The seventh condition comprises: an error between a state of charge corresponding to a second open circuit voltage in the charging open circuit voltage curve and a state of charge corresponding to the second open circuit voltage in a charging open circuit voltage curve with an initial state of charge being 0% falls into a preset error accuracy range.

The second open circuit voltage is acquired, and the state of charge corresponding to the second open circuit voltage is searched in each charging open circuit voltage curve. A limit initial state of charge in this embodiment of the present application comprises 0%. Detection is performed on an error between the state of charge corresponding to the second open circuit voltage in each charging open circuit voltage curve and the state of charge corresponding to the second open circuit voltage in the charging open circuit voltage curve with the initial state of charge being 0% (namely, a fully-discharged charging open circuit voltage curve). The preset error accuracy range is an acceptable error accuracy range during calculation of the state of charge. When an error falls into the preset error accuracy range, it indicates that a state of charge in a charging open circuit voltage curve does not have an unacceptable effect on the calculation of the state of charge, and the accuracy of data acquired from the charging open circuit curve is rela- In step S1021b, a maximum allowed accumulative discharging capacity and a minimum required accumulative charging capacity corresponding to a current open circuit voltage are obtained according to an accumulative capacity correspondence relationship corresponding to the charging state of the battery cell.

The accumulative capacity correspondence relationship in the above embodiment comprises a correspondence relationship between a pre-measured open circuit voltage and the maximum allowed accumulative discharging capacity and a correspondence relationship between the pre-measured open circuit voltage and the minimum required accumulative charging capacity. For example, the accumulative capacity correspondence relationship can be indicated in the form of a table. Table 2 is a table of the accumulative capacity correspondence relationship in this embodiment of the present application:

TABLE 2

| Open circuit voltage | | OCV1 | OCV2 | OCV3 | OCV4 | OCV5 |
|---|---|---|---|---|---|---|
| Discharging state | Minimum required accumulative discharging capacity | Charging capacity E1 | Charging capacity E2 | Charging capacity E3 | Charging capacity E4 | Charging capacity E5 |
| | Maximum allowed accumulative charging capacity | Discharging capacity F1 | Discharging capacity F2 | Discharging capacity F3 | Discharging capacity F4 | Discharging capacity F5 | tively high. Therefore, the charging open circuit curve can be used to acquire an accumulative capacity threshold, so as to establish an accumulative capacity correspondence relationship.

In step S105b, the accumulative discharging capacity with a maximum value is used as a maximum allowed accumulative discharging capacity, and the accumulative charging capacity with a minimum value is used as a minimum required accumulative charging capacity.

In step S104b, a plurality of charging open circuit voltage curves that meet the preset error accuracy range may be obtained, and each charging open circuit curve correspondingly has an accumulative discharging capacity and an accumulative charging capacity. A maximum value of accumulative discharging capacities corresponding to the plurality of charging open circuit curves is used as the maximum allowed accumulative discharging capacity. A minimum value of accumulative charging capacities corresponding to the plurality of charging open circuit curves is used as the minimum required accumulative charging capacity.

The maximum allowed accumulative discharging capacity refers to a discharging capacity which can be at most discharged by the battery cell in order to prevent a charging open circuit curve from being influenced by a historical operating condition. The minimum required accumulative charging capacity refers to a charging capacity at least required to be charged to the battery cell in order to prevent a charging open circuit curve from being influenced by the historical operating condition. If the accumulative charging capacity is less than the minimum required accumulative charging capacity, it cannot be guaranteed that a charging open circuit curve at this moment coincides with or is close enough to a fully-discharged charging open circuit voltage curve.

Minimum required accumulative charging capacities and maximum allowed accumulative discharging capacities respectively corresponding to the five open circuit voltages, namely, OCV1, OCV2, OCV3, OCV4 and OCV5, in the charging state are recorded in Table 2. A corresponding minimum required accumulative charging capacity and maximum allowed accumulative discharging capacity can be queried according to an open circuit voltage in Table 2. For example, if the current open circuit voltage of the battery cell is OCV2, the open circuit voltage OCV2 corresponds to the minimum required accumulative charging capacity E2 and the maximum allowed accumulative discharging capacity F2.

In step S1022b, if an eighth condition is met, a state of charge corresponding to the current open circuit voltage in the charging open circuit voltage curve with the initial state of charge being 0% is used as a corrected state of charge of the battery cell.

The eighth condition comprises: an acquired current accumulative discharging capacity is less than the maximum allowed accumulative discharging capacity corresponding to the current open circuit voltage, and an acquired current accumulative charging capacity is greater than the minimum required accumulative charging capacity corresponding to the current open circuit voltage.

The limit initial state of charge comprises 0%.

In the above embodiment, a current accumulative capacity of the battery cell comprises the current accumulative charging capacity $\Delta ChrgCap$ and the current accumulative discharging capacity $\Delta DischrgCap$. If the acquired current accumulative discharging capacity $\Delta DischrgCap$ is less than the maximum allowed accumulative discharging capacity $\Delta MaxCap\_Dischrg$ corresponding to the current open circuit voltage in the accumulative capacity correspondence relationship, and the acquired current accumulative charging capacity ΔChrgCap is greater than the minimum required accumulative charging capacity ΔMinCap_Chrg corresponding to the current open circuit voltage in the accumulative capacity correspondence relationship, the charging open circuit voltage curve with the initial state of charge being 0% (namely, a fully-discharged charging open circuit voltage curve) may be directly used to correct the state of charge of the battery cell. Specifically, the state of charge corresponding to the current open circuit voltage in the charging open circuit voltage curve with the initial state of charge being 0% is used as the corrected state of charge of the battery cell.

In step S1023b, if a ninth condition is met, a calculated state of charge of the battery cell, a state of charge corresponding to a maximum open circuit voltage in a discharging open circuit voltage curve with an initial state of charge being 100%, and a state of charge corresponding to a minimum open circuit voltage in the charging open circuit voltage curve with the initial state of charge being 0% are compared.

The ninth condition comprises: an acquired current accumulative discharging capacity is greater than or equal to the maximum allowed accumulative discharging capacity corresponding to the current open circuit voltage, or an acquired current accumulative charging capacity is less than or equal to the minimum required accumulative charging capacity corresponding to the current open circuit voltage.

If the acquired current accumulative discharging capacity ΔDischrgCap is greater than or equal to the maximum allowed accumulative discharging capacity ΔMaxCap_Dischrg corresponding to the current open circuit voltage in the accumulative capacity correspondence relationship, or the acquired current accumulative charging capacity ΔChrgCap is less than or equal to the minimum required accumulative charging capacity ΔMinCap_Chrg corresponding to the current open circuit voltage in the accumulative capacity correspondence relationship, the calculated state of charge of the battery cell can be corrected by means of the following steps S1024b to S1026b based on the calculated state of charge of the battery cell, the state of charge corresponding to the maximum open circuit voltage (namely, a maximum value of the corrected state of charge) in the discharging open circuit voltage curve with the initial state of charge being 100% (namely, a fully-charged discharging open circuit voltage curve), and the state of charge corresponding to the minimum open circuit voltage (namely, a minimum value of the corrected state of charge) in the charging open circuit voltage curve with the initial state of charge being 0% (namely, a fully-discharged charging open circuit curve).

In step S1024b, if a tenth condition is met, the state of charge corresponding to the maximum open circuit voltage in the discharging open circuit voltage curve with the initial state of charge being 100% is used as a corrected state of charge of the battery cell.

The tenth condition comprises: the calculated state of charge of the battery cell is greater than the state of charge corresponding to the maximum open circuit voltage in the discharging open circuit voltage curve with the initial state of charge being 100%.

In step S1025b, if an eleventh condition is met, the state of charge corresponding to the minimum open circuit voltage in the charging open circuit voltage curve with the initial state of charge being 0% is used as a determined corrected state of charge of the battery cell.

The eleventh condition comprises: the calculated state of charge of the battery cell is less than the state of charge corresponding to the minimum open circuit voltage in the charging open circuit voltage curve with the initial state of charge being 0%.

In step S1026b, if a twelfth condition is met, the calculated state of charge of the battery cell is used as a corrected state of charge of the battery cell.

The twelfth condition comprises: the calculated state of charge of the battery cell is less than or equal to the state of charge corresponding to the maximum open circuit voltage in the discharging open circuit voltage curve with the initial state of charge being 100%, and is greater than or equal to the state of charge corresponding to the minimum open circuit voltage in the charging open circuit voltage curve with the initial state of charge being 0%.

The limit initial state of charge comprises 100% and 0%.

Description of correcting the calculated state of charge of the battery cell in steps from S1024b to S1026b is similar to that in steps from S1024a to S1026a in the above embodiment, and reference may be made to relevant content in the steps from S1024a to S1026a in the above embodiment. Details are not repeatedly described here.

In some other embodiments, in the step S101 of the above embodiment, the operating state of the battery cell may be specifically determined according to comparison between the current accumulative charging capacity and the current accumulative discharging capacity of the battery cell. The current accumulative charging capacity of the battery cell is an accumulative charging capacity of the battery cell in a time period up to a current moment. The current accumulative discharging capacity of the battery cell is an accumulative discharging capacity of the battery cell in the time period up to the current moment.

For example, if the current accumulative charging capacity of the battery cell is less than the current accumulative discharging capacity of the battery cell, it is determined that the operating state of the battery cell comprises the discharging state. If the current accumulative charging capacity of the battery cell is greater than the current accumulative discharging capacity of the battery cell, it is determined that the operating state of the battery cell comprises the charging state.

Specifically, a difference ΔChrgCap-ΔDischrgCap between the current accumulative charging capacity ΔChrgCap of the battery cell and the current accumulative discharging capacity ΔDischrgCap of the battery cell may be calculated. If ΔChrgCap-ΔDischrgCap<0, it is determined that the operating state of the battery cell comprises the discharging state. If ΔChrgCap-ΔDischrgCap>0, it is determined that the operating state of the battery cell comprises the charging state.

In some other embodiments, in order to further improve accuracy of calculation of the state of charge, it is necessary to guarantee that a standing time of the battery cell is long enough to guarantee the accuracy of a parameter acquired during calculation of the state of charge. In this embodiment of the present application, minimum standing duration of the battery cell may be obtained, and if standing duration of the battery cell exceeds the minimum standing duration, the step of correcting a state of charge in the above embodiment may be performed. If standing duration of the battery cell does not exceed the minimum standing duration, the step of correcting a state of charge in the above embodiment may not be performed, and when the standing duration of the battery cell exceeds the minimum standing duration, the step of correcting a state of charge in the above embodiment is performed.

Specifically, a current temperature of the battery cell may be acquired, and minimum standing duration corresponding to the current temperature is obtained in a correspondence relationship between a pre-measured temperature and a minimum standing time. Standing duration of the battery cell up to a current moment is acquired, and if the standing duration of the battery cell is longer than the minimum standing duration corresponding to the current temperature, the operating state of the battery cell is determined.

A correspondence relationship between a temperature and a minimum standing time can be obtained by means of experimental detection of a battery cell or a battery module or a battery pack. In the correspondence relationship between the temperature and the minimum standing time, a corresponding minimum standing time may be obtained through querying with a temperature.

In some examples, statistics collection is performed on the standing duration of the battery cell up to the current moment, specifically, continuous duration T1 when a current in a circuit where the battery cell is located is continuously less than a preset current error threshold is detected in real-time.

In some other examples, statistics collection is performed on the standing duration of the battery cell up to the current moment, specifically, a sum of a sleeping time T2 of the battery cell and continuous duration T1 when a current in a circuit where the battery cell is located is continuously less than a preset current error threshold is detected in real-time.

Figure 4:
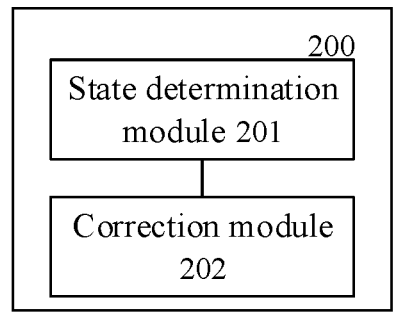
FIG. 4 is a schematic structural diagram of an apparatus for correcting a state of charge according to an embodiment of the present application.

FIG. 4 is a schematic structural diagram of an apparatus for correcting a state of charge according to an embodiment of the present application. As shown in FIG. 4, the apparatus 200 for correcting a state of charge comprises a state determination module 201 and a correction module 202.

The state determination module 201 is configured to determine an operating state of a battery cell, wherein the operating state comprises a discharging state or a charging state.

The correction module 202 is configured to determine a corrected state of charge of the battery cell according to an acquired current open circuit voltage of the battery cell, an acquired current accumulative capacity of the battery cell, an accumulative capacity correspondence relationship corresponding to the operating state of the battery cell, and an open circuit voltage curve corresponding to a limit initial state of charge, wherein the accumulative capacity correspondence relationship comprises a correspondence relationship between a pre-measured open circuit voltage and an accumulative capacity threshold.

In this embodiment of the present application, an operating state of a battery cell is determined, and a corrected state of charge of the battery cell is determined according to an acquired current open circuit voltage of the battery cell, an acquired current accumulative capacity of the battery cell, an accumulative capacity correspondence relationship corresponding to the operating state of the battery cell, and an open circuit voltage curve corresponding to a limit initial state of charge, wherein the accumulative capacity correspondence relationship comprises a correspondence relationship between a pre-measured open circuit voltage and an accumulative capacity threshold. The accumulative capacity correspondence relationship may represent a historical operating condition of the battery cell. A parameter capable of guaranteeing the historical operating condition of the battery cell is introduced into a calculation process of the state of charge, that is to say, in the calculation process of the state of charge, the state of charge of the battery cell is corrected by considering the historical operating condition of the battery cell, and the corrected state of charge is used as the state of charge of the battery cell, thereby reducing influence of the historical operating condition on calculation of the state of charge, and improving the accuracy of calculation of the state of charge. Moreover, since a calculated state of charge can be corrected, applicability of calculation of the state of charge is further improved.

In some examples, the current accumulative capacity comprises a current accumulative charging capacity and a current accumulative discharging capacity. The state determination module 201 can be specifically configured to acquire the current accumulative charging capacity and the current accumulative discharging capacity of the battery cell, determine that the operating state of the battery cell comprise the discharging state if the current accumulative charging capacity of the battery cell is less than the current accumulative discharging capacity of the battery cell, and determine that the operating state of the battery cell comprises the charging state if the current accumulative charging capacity of the battery cell is greater than the current accumulative discharging capacity of the battery cell.

In some examples, the state determination module is specifically configured to acquire a current temperature of the battery cell, obtain minimum standing duration corresponding to the current temperature from a correspondence relationship between a pre-measured temperature and a minimum standing time, acquire standing duration of the battery cell up to a current moment, and determine the operating state of the battery cell if the standing duration of the battery cell is longer than the minimum standing duration corresponding to the current temperature.

Figure 5:
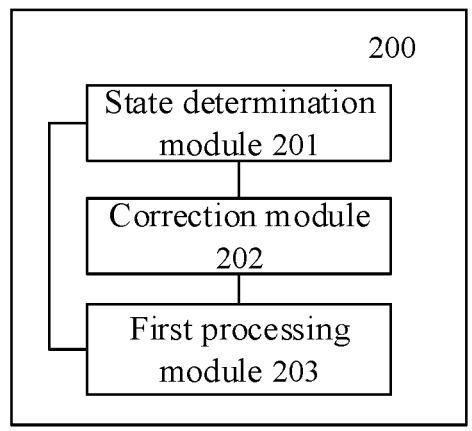
FIG. 5 is a schematic structural diagram of an apparatus for correcting a state of charge according to another embodiment of the present application.

FIG. 5 is a schematic structural diagram of an apparatus for correcting a state of charge according to another embodiment of the present application. A difference between FIG. 5 and FIG. 4 lies in that the apparatus 200 for correcting a state of charge shown in FIG. 5 may further comprise a first processing module 203.

The first processing module 203 is configured to acquire discharging open circuit voltage curves with different initial states of charge under different discharging conditions; acquire an accumulative charging capacity and an accumulative discharging capacity corresponding to the discharging open circuit voltage curve if an error between a state of charge corresponding to a first open circuit voltage in the discharging open circuit voltage curve and a state of charge corresponding to the first open circuit voltage in a discharging open circuit voltage curve with an initial state of charge being 100% falls into a preset error accuracy range; and use the accumulative discharging capacity with a minimum value as a minimum required accumulative discharging capacity, and use the accumulative charging capacity with a maximum value as a maximum allowed accumulative charging capacity. The operating state comprises the discharging state, and the accumulative capacity threshold comprises the minimum required accumulative discharging capacity and the maximum allowed accumulative charging capacity.

The above correction module 202 can be specifically configured to: obtain, according to an accumulative capacity correspondence relationship corresponding to the discharging state of the battery cell, a minimum required accumulative discharging capacity and a maximum allowed accumulative charging capacity corresponding to the current open circuit voltage, and use, as the corrected state of charge of the battery cell, a state of charge corresponding to the current open circuit voltage in a discharging open circuit voltage curve with an initial state of charge being 100% if the acquired current accumulative charging capacity is less than the maximum allowed accumulative charging capacity corresponding to the current open circuit voltage, and the acquired current accumulative discharging capacity is greater than the minimum required accumulative discharging capacity corresponding to the current open circuit voltage.

The operating state comprises the discharging state. The accumulative capacity threshold comprises the minimum required accumulative discharging capacity and the maximum allowed accumulative charging capacity. The current accumulative capacity comprises the current accumulative charging capacity and the current accumulative discharging capacity. The limit initial state of charge comprises 100%.

The above correction module 202 can be specifically configured to: obtain, according to an accumulative capacity correspondence relationship corresponding to the discharging state of the battery cell, a minimum required accumulative discharging capacity and a maximum allowed accumulative charging capacity corresponding to the current open circuit voltage; compare a calculated state of charge of the battery cell, a state of charge corresponding to a maximum open circuit voltage in a discharging open circuit voltage curve with an initial state of charge being 100%, and a state of charge corresponding to a minimum open circuit voltage in a charging open circuit voltage curve with an initial state of charge being 0% if the acquired current accumulative charging capacity is greater than or equal to the maximum allowed accumulative charging capacity corresponding to the current open circuit voltage, or the acquired current accumulative discharging capacity is less than or equal to the minimum required accumulative discharging capacity corresponding to the current open circuit voltage; use, as the corrected state of charge of the battery cell, the state of charge corresponding to the maximum open circuit voltage in the discharging open circuit voltage curve with the initial state of charge being 100% if the calculated state of charge of the battery cell is greater than the state of charge corresponding to the maximum open circuit voltage in the discharging open circuit voltage curve with the initial state of charge being 100%; use, as the corrected state of charge of the battery cell, the state of charge corresponding to the minimum open circuit voltage in the charging open circuit voltage curve with the initial state of charge being 0% if the calculated state of charge of the battery cell is less than the state of charge corresponding to the minimum open circuit voltage in the charging open circuit voltage curve with the initial state of charge being 0%; and use the calculated state of charge of the battery cell as the corrected state of charge of the battery cell if the calculated state of charge of the battery cell is less than or equal to the state of charge corresponding to the maximum open circuit voltage in the discharging open circuit voltage curve with the initial state of charge being 100%, and is greater than or equal to the state of charge corresponding to the minimum open circuit voltage in the charging open circuit voltage curve with the initial state of charge being 0%.

The operating state comprises the discharging state. The accumulative capacity threshold comprises the minimum required accumulative discharging capacity and the maximum allowed accumulative charging capacity. The current accumulative capacity comprises the current accumulative charging capacity and the current accumulative discharging capacity. The limit initial state of charge comprises 100% and 0%.

Figure 6:
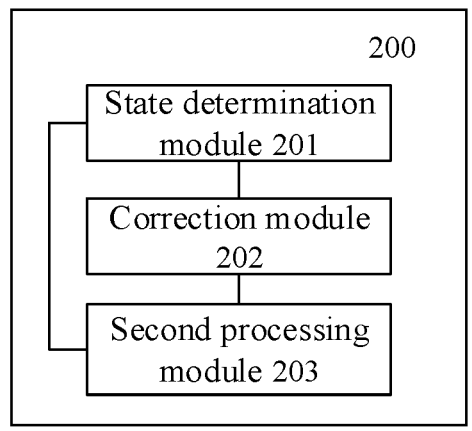
FIG. 6 is a schematic structural diagram of an apparatus for correcting a state of charge according to still another embodiment of the present application.

FIG. 6 is a schematic structural diagram of an apparatus for correcting a state of charge according to still another embodiment of the present application. A difference between FIG. 6 and FIG. 4 lies in that the apparatus 200 for correcting a state of charge shown in FIG. 6 may further comprise a second processing module 204.

The second processing module 204 is configured to: acquire charging open circuit voltage curves with different initial states of charge under different charging conditions; acquire an accumulative charging capacity and an accumulative discharging capacity corresponding to the charging open circuit voltage curve if an error between a state of charge corresponding to a second open circuit voltage in the charging open circuit voltage curve and a state of charge corresponding to the second open circuit voltage in a charging open circuit voltage curve with an initial state of charge being 0% falls into a preset error accuracy range; and use the accumulative discharging capacity with a maximum value as a maximum allowed accumulative discharging capacity, and use the accumulative charging capacity with a minimum value and a minimum required accumulative charging capacity.

The operating state comprises the charging state, and an accumulative capacity threshold comprises the maximum allowed accumulative discharging capacity and the minimum required accumulative charging capacity.

The above correction module 202 can be specifically configured to: obtain, according to an accumulative capacity correspondence relationship corresponding to the charging state of the battery cell, a maximum allowed accumulative discharging capacity and a minimum required accumulative charging capacity corresponding to the current open circuit voltage, and use, as the corrected state of charge of the battery cell, a state of charge corresponding to the current open circuit voltage in a charging open circuit voltage curve with an initial state of charge being 0% if the acquired current accumulative discharging capacity is less than the maximum allowed accumulative discharging capacity corresponding to the current open circuit voltage, and the acquired current accumulative charging capacity is greater than the minimum required accumulative charging capacity corresponding to the current open circuit voltage.

The operating state comprises the charging state. An accumulative capacity threshold comprises the maximum allowed accumulative discharging capacity and the minimum required accumulative charging capacity. The current accumulative capacity comprises the current accumulative charging capacity and the current accumulative discharging capacity. The limit initial state of charge comprises 0%.

The correction module 202 can be specifically configured to: obtain, according to an accumulative capacity correspondence relationship corresponding to the discharging state of the battery cell, a maximum allowed accumulative discharging capacity and a minimum required accumulative charging capacity corresponding to the current open circuit voltage; compare a calculated state of charge of the battery cell, a state of charge corresponding to a maximum open circuit voltage in a discharging open circuit voltage curve with an initial state of charge being 100%, and a state of charge corresponding to a minimum open circuit voltage in a charging open circuit voltage curve with an initial state of charge being 0% if the acquired current accumulative discharging capacity is greater than or equal to the maximum allowed accumulative discharging capacity corresponding to the current open circuit voltage, or the acquired current accumulative charging capacity is less than or equal to the minimum required accumulative charging capacity corresponding to the current open circuit voltage; use, as the corrected state of charge of the battery cell, the state of charge corresponding to the maximum open circuit voltage in the discharging open circuit voltage curve with the initial state of charge being 100% if the calculated state of charge of the battery cell is greater than the state of charge corresponding to the maximum open circuit voltage in the discharging open circuit voltage curve with the initial state of charge being 100%; use, as the determined corrected state of charge of the battery cell, the state of charge corresponding to the minimum open circuit voltage in the charging open circuit voltage curve with the initial state of charge being 0% if the calculated state of charge of the battery cell is less than the state of charge corresponding to the minimum open circuit voltage in the charging open circuit voltage curve with the initial state of charge being 0%; and use the calculated state of charge of the battery cell as the corrected state of charge of the battery cell if the calculated state of charge of the battery cell is less than or equal to the state of charge corresponding to the maximum open circuit voltage in the discharging open circuit voltage curve with the initial state of charge being 100%, and is greater than or equal to the state of charge corresponding to the minimum open circuit voltage in the charging open circuit voltage curve with the initial state of charge being 0%.

The operating state comprises the charging state. An accumulative capacity threshold comprises the maximum allowed accumulative discharging capacity and the minimum required accumulative charging capacity. The current accumulative capacity comprises the current accumulative charging capacity and the current accumulative discharging capacity. The limit initial state of charge comprises 100% and 0%.

In some examples, the current accumulative capacity is an accumulative capacity in a time period up to a current moment, and the time period up to the current moment does not comprise standing time.

The accumulative capacity threshold is obtained through statistics collection in a preset time period, and the preset time period does not comprise the standing time.

Figure 7:
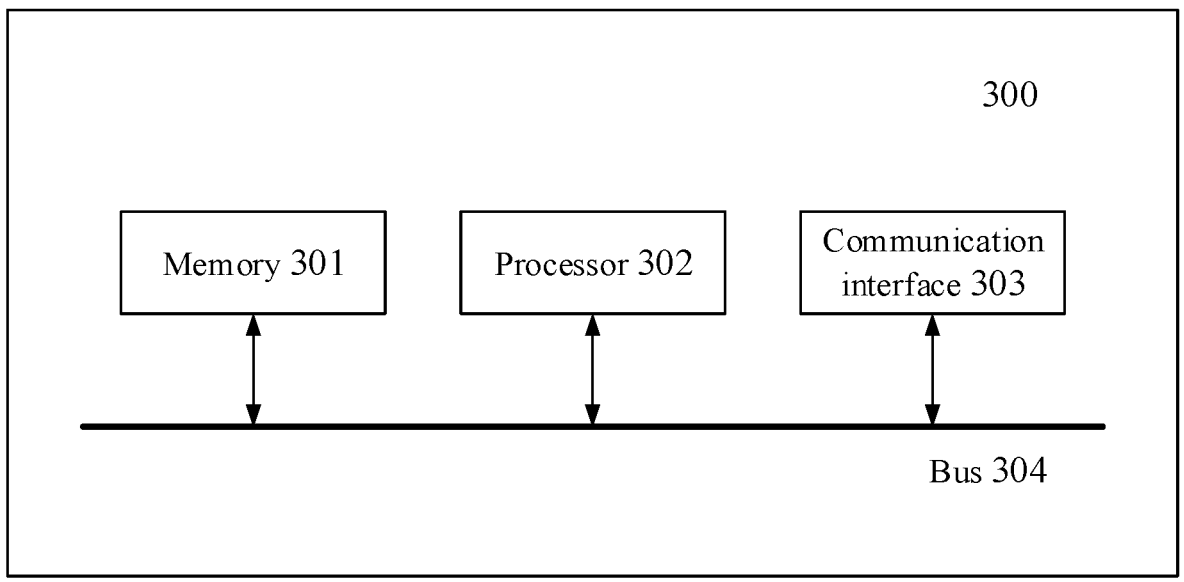
FIG. 7 is a schematic structural diagram of a device for correcting a state of charge according to an embodiment of the present application.

FIG. 7 is a schematic structural diagram of a device for correcting a state of charge according to an embodiment of the present application. As shown in FIG. 7, the device 300 for correcting a state of charge comprises a memory 301, a processor 302 and a program stored on the memory 301 and capable of running on the processor 302.

In one example, the processor 302 may comprise a central processing unit (CPU) or an application-specific integrated circuit (ASIC), or may be configured as one or more integrated circuits to implement the embodiments of the present application.

The memory 301 may comprise a mass memory used for data or instructions. By way of example and not limitation, the memory 301 may comprise an HDD, a floppy disk drive, a flash memory, an optical disc, a magneto-optical disk, a tape or universal serial bus (USB) drive, or a combination of two or more of those listed above. Where appropriate, the memory 301 may comprise a removable or non-removable (or fixed) medium. Where appropriate, the memory 301 can turn on the inside or outside of the device 300 for correcting a state of charge at a terminal hot spot. In a particular embodiment, the memory 301 is a non-volatile solid state memory. In a particular embodiment, the memory 301 comprises a read-only memory (ROM). Where appropriate, the ROM can be a mask-programmed ROM, a programmable ROM (PROM), an erasable PROM (EPROM), an electrically erasable PROM (EEPROM), an electrically alterable ROM (EAROM), or a flash memory or a combination of two or more of those listed above.

The processor 302 runs a program corresponding to an executable program code by reading the executable program code stored in memory 301, so as to implement the method for correcting a state of charge in the above embodiment.

In one example, the device 300 for correcting a state of charge may further comprise a communication interface 303 and a bus 304. As shown in FIG. 7, the memory 301, the processor 302 and the communication interface 303 are connected and communicate with each other by means of the bus 304.

The communication interface 303 is mainly configured to implement communication among modules, apparatuses, units and/or devices in the embodiments of the present application. The communication interface 303 may further be used for connection to an input device and/or an output device.

The bus 304 comprises hardware, software, or both, and couples components of the device 300 for correcting a state of charge together. By way of example and not limitation, the bus 304 may comprise an accelerate graphical port (AGP) or other graphics buses, an enhanced industry standard architecture (EISA) bus, a front side bus (FSB), hyper-transport (HT) interconnection, an industry standard architecture (ISA) bus, infiniband interconnection, a low pin count (LPC) bus, a memory bus, a micro channel architecture (MCA) bus, a peripheral component interconnect (PCI) bus, a PCI-express (PCI-X) bus, a serial advanced technology attachment (SATA) bus, a video electronics standards association local (VLB) bus, or other suitable buses or a combination of two or more those listed above. Where appropriate, the bus 304 may comprise one or more buses. Although this embodiment of the present application describes and shows a specific bus, the present application considers any suitable bus or interconnection.

An embodiment of the present application further provides a storage medium having a computer program stored thereon, wherein the program may implement, when executed by a processor, the method for correcting a state of charge in the above embodiment.

To be clear, embodiments in this specification are all described in a progressive manner, for the same or similar parts of the embodiments, reference may be made to each other, and each embodiment focuses on description of differences from other embodiments. For relevant content of the apparatus embodiment, the device embodiment and the storage medium embodiment, reference may be made to a description part of the method embodiment. The present application is not limited to the specific steps and structures described above and shown in the figure. After understanding the spirit of the present application, those skilled in the art can make various changes, modifications and additions, or change the order of the steps. In addition, for the sake of simplicity, a detailed description of a known method or technology is omitted here.

Those skilled in the art should understand that the above embodiments are exemplary rather than restrictive. Different technical features in different embodiments may be combined to achieve beneficial effects. On the basis of studying the accompanying drawings, the description and the claims, those skilled in the art should be able to understand and implement other variant embodiments of the disclosed embodiments. In the claims, the term "including" does not exclude other apparatuses or steps, the indefinite term "a" does not exclude more than one, and the terms "first" and "second" are used to indicate names rather than to represent any particular order. Any reference numeral in the claims should not be understood as a limitation to the protection scope. Functions of a plurality of parts in the claims may be implemented by a single hardware or software module. The presence of certain technical features in different subordinate claims does not mean that they cannot be combined for beneficial effects.

What is claimed is:

1. A method for correcting a state of charge, comprising:
   determining an operating state of a battery cell, wherein the operating state comprises a discharging state;
   acquiring a current open circuit voltage of the battery cell;
   acquiring a current accumulative charging capacity and a current accumulative discharging capacity of the battery cell; and
   using, as a corrected state of charge of the battery cell, a state of charge corresponding to the current open circuit voltage in a discharging open circuit voltage curve with an initial state of charge being 100% when the current accumulative charging capacity is less than a maximum allowed accumulative charging capacity corresponding to the current open circuit voltage, and the current accumulative discharging capacity is greater than a minimum required accumulative discharging capacity corresponding to the current open circuit voltage.

2. The method for correcting a state of charge according to claim 1, wherein the method for correcting a state of charge further comprising:
   determining the corrected state of charge of the battery cell according to the corrected state of charge of the battery cell, a first state of charge corresponding to a maximum open circuit voltage in a discharging open circuit voltage curve with an initial state of charge being 100%, and a second state of charge corresponding to a minimum open circuit voltage in a charging open circuit voltage curve with an initial state of charge being 0% when the current accumulative charging capacity is greater than or equal to the maximum allowed accumulative charging capacity corresponding to the current open circuit voltage, or the current accumulative discharging capacity is less than or equal to the minimum required accumulative discharging capacity corresponding to the current open circuit voltage.

3. The method for correcting a state of charge according to claim 2, wherein the determining the corrected state of charge of the battery cell comprises:
   using, as the corrected state of charge of the battery cell, the state of charge corresponding to the maximum open circuit voltage in the discharging open circuit voltage curve with the initial state of charge being 100% when the calculated state of charge of the battery cell is greater than the first state of charge.

4. The method for correcting a state of charge according to claim 2, wherein the determining the corrected state of charge of the battery cell comprises:
   using, as the corrected state of charge of the battery cell, the state of charge corresponding to the minimum open circuit voltage in the charging open circuit voltage curve with the initial state of charge being 0% when the calculated state of charge of the battery cell is less than the second state of charge.

5. The method for correcting a state of charge according to claim 2, wherein the determining the corrected state of charge of the battery cell comprises:
   using the calculated state of charge of the battery cell as the corrected state of charge of the battery cell when the calculated state of charge of the battery cell is less than or equal to the first state of charge, and is greater than or equal to the second state of charge.

6. The method for correcting a state of charge according to claim 1, wherein the determining an operating state of a battery cell comprises:
   acquiring a current temperature of the battery cell, and standing duration of the battery cell up to a current moment;
   obtaining minimum standing duration corresponding to the current temperature; and
   determining the operating state of the battery cell when the standing duration of the battery cell is longer than the minimum standing duration.

7. The method for correcting a state of charge according to claim 1, wherein the determining an operating state of a battery cell comprises:
   determining that the operating state of the battery cell is the discharging state when the current accumulative charging capacity is less than the current accumulative discharging capacity.

8. An apparatus for correcting a state of charge, comprising:
   a state determination module configured to determine an operating state of a battery cell, wherein the operating state comprises a discharging state; and
   a correction module configured to acquire a current open circuit voltage of the battery cell, a current accumulative charging capacity and a current accumulative discharging capacity of the battery cell;
   the correction module is further configured to:
   use, as a corrected state of charge of the battery cell, a state of charge corresponding to the current open circuit voltage in a discharging open circuit voltage curve with an initial state of charge being 100% when the current accumulative charging capacity is less than a maximum allowed accumulative charging capacity corresponding to the current open circuit voltage, and the current accumulative discharging capacity is greater than a minimum required accumulative discharging capacity corresponding to the current open circuit voltage.

9. The apparatus for correcting a state of charge according to claim 8, the correction module is further configured to:
   determine the corrected state of charge of the battery cell according to the corrected state of charge of the battery cell, a first state of charge corresponding to a maximum open circuit voltage in a discharging open circuit voltage curve with an initial state of charge being 100%, and a second state of charge corresponding to a minimum open circuit voltage in a charging open circuit voltage curve with an initial state of charge being 0% when the current accumulative charging capacity is greater than or equal to the maximum allowed accumulative charging capacity corresponding to the current open circuit voltage, or the current accumulative discharging capacity is less than or equal to the minimum required accumulative discharging capacity corresponding to the current open circuit voltage.

10. The apparatus for correcting a state of charge according to claim 9, the correction module is configured to:
    use, as the corrected state of charge of the battery cell, the state of charge corresponding to the maximum open circuit voltage in the discharging open circuit voltage curve with the initial state of charge being 100% when the calculated state of charge of the battery cell is greater than the first state of charge.

11. The apparatus for correcting a state of charge according to claim 9, the correction module is configured to:
use, as the corrected state of charge of the battery cell, the state of charge corresponding to the minimum open circuit voltage in the charging open circuit voltage curve with the initial state of charge being 0% when the calculated state of charge of the battery cell is less than the second state of charge.

12. The apparatus for correcting a state of charge according to claim 9, the correction module is configured to:
use the calculated state of charge of the battery cell as the corrected state of charge of the battery cell when the calculated state of charge of the battery cell is less than or equal to the first state of charge, and is greater than or equal to the second state of charge.

13. The apparatus for correcting a state of charge according to claim 8, the state determination module is configured to:
acquire a current temperature of the battery cell, and standing duration of the battery cell up to a current moment;
obtain minimum standing duration corresponding to the current temperature; and
determine the operating state of the battery cell when the standing duration of the battery cell is longer than the minimum standing duration.

14. The apparatus for correcting a state of charge according to claim 8, the state determination module is configured to:
determine that the operating state of the battery cell is the discharging state when the current accumulative charging capacity is less than the current accumulative discharging capacity.

* * * * *